United States Patent
Darr et al.

(10) Patent No.: US 7,083,431 B1
(45) Date of Patent: Aug. 1, 2006

(54) METHOD AND SYSTEM OF ELECTRICALLY CONNECTING MULTIPLE PRINTED CIRCUIT BOARDS

(75) Inventors: Christopher J. Darr, Livonia, MI (US); Peter Kowtun, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/162,230

(22) Filed: Sep. 2, 2005

(51) Int. Cl.
*H01R 12/00* (2006.01)

(52) U.S. Cl. .................. 439/75; 439/751; 439/752.5; 439/943

(58) Field of Classification Search .................. 439/75, 439/82, 751, 752.5, 943
See application file for complete search history.

(56) References Cited

U.S. PATENT DOCUMENTS

| | | | |
|---|---|---|---|
| 3,568,001 A | 3/1971 | Straus | |
| 3,980,367 A | 9/1976 | Laserson et al. | |
| 4,390,221 A | 6/1983 | Niles et al. | |
| 4,446,505 A | 5/1984 | Long et al. | |
| 5,106,310 A | 4/1992 | Krajewski et al. | |
| 5,715,595 A | 2/1998 | Kman et al. | |
| 5,761,050 A | 6/1998 | Archer | |
| 5,963,432 A * | 10/1999 | Crowley | 361/804 |
| 5,980,271 A | 11/1999 | MacDougall et al. | |
| 6,305,949 B1 * | 10/2001 | Okuyama et al. | 439/75 |
| 6,386,890 B1 | 5/2002 | Bhatt et al. | |
| 6,428,329 B1 | 8/2002 | Orui et al. | |
| 6,582,510 B1 | 6/2003 | Schwartz | |
| 6,623,280 B1 | 9/2003 | Oldenburg et al. | |
| 6,773,269 B1 | 8/2004 | Downes | |
| 6,802,720 B1 | 10/2004 | Weiss et al. | |
| 6,805,576 B1 | 10/2004 | Feye Hohmann et al. | |
| 6,901,646 B1 | 6/2005 | Yoon | |
| 6,863,543 B1 | 8/2005 | Lang et al. | |
| 2002/0182900 A1 | 12/2002 | Brodsky et al. | |
| 2003/0092296 A1 | 5/2003 | Oldenburg et al. | |
| 2005/0124184 A1 | 6/2005 | Hubert | |

* cited by examiner

*Primary Examiner*—Tho D. Ta
*Assistant Examiner*—Vanessa Girardi
(74) *Attorney, Agent, or Firm*—Brooks Kushman P.C.

(57) ABSTRACT

Method and system of electrically connecting multiple printed circuit boards (PCBs). A pin may be used for establishing electrical connecting the PCBs. The PCBs may include one or more openings for receiving one or more corresponding pins. The pins may include securing and alignment features to facilitate proper securing and assembly.

20 Claims, 1 Drawing Sheet

METHOD AND SYSTEM OF ELECTRICALLY CONNECTING MULTIPLE PRINTED CIRCUIT BOARDS

TECHNICAL FIELD

The present invention relates to methods and systems of electrically connecting multiple printed circuit boards (PCBs).

BACKGROUND

Printed circuit boards (PCBs) may be used in any number of environments to provider circuitry and other features associated with executing electrically driven operations. PCBs are commonly used in junction boxes, such as those found in automotive vehicles. In many cases, multiple PCBs may be required to execute particular operations with some transfer of electricity therebetween. As such, a need exists for a method and system of electrically connecting multiple PCBs.

SUMMARY OF THE INVENTION

One non-limiting aspect of the present invention relates to electrically connecting multiple PCBs with an electrically conducting pin. The PCBs may include openings for receiving the pin and providing a current path thereto, thereby providing an electrical connection therebetween.

One aspect of the present invention relates to a system for solderlessly providing an electrical connection between at least two printed circuit boards (PCBs). The system may include an electrically conducting pin having multiple securing features, at least one securing feature for each PCB, and a first alignment feature to facilitate orientating the pin relative to each PCB. The system may further include a second alignment feature on one of the PCBs operatively configured to operate with the first alignment feature to facilitate alignment of the pin relative to each PCB.

One or more of the securing features may be a press-fit feature configured to secure the pin through forceful exertion against at least one of the PCBs. Optionally, the press-fit feature and the first alignment feature may be located proximate a common end of the pin.

Optionally, the first and second alignment features may cooperate to require insertion of an end of the pin opposite the first alignment feature through the opening associated with the PCB having the second alignment feature before insertion of the end of the pin having the first alignment feature through the opening associated with the PCB having the second alignment feature in order to properly insert the pin within each opening.

The PCB openings may be circular openings. Optionally, the second alignment feature may be a circular opening configured to cooperate with one of the other circular openings. For example, at least a portion of a circumference of the opening of the second alignment feature may intersects with at least a portion of a circumference of the other circular openings.

The pin may include a connection feature at at least one end for receiving a mating feature. The alignment features may be configured to require the connection feature end of the pin to extend from a top-side of the first PCB when properly assembled.

One aspect of the present invention relates to a method of solderlessly providing an electrical connection between at least two printed circuit boards (PCBs). The method may include configuring each PCB to include openings for receiving an electrically conducting pin having properties sufficient for providing the electrical connection between the PCBs, configuring only one of the PCBs to include a first alignment feature, the first alignment feature cooperating with at least one of the openings, configuring press-fit securing features for securing the pin through forceful exertion against the opening, and configuring the pin to include a second alignment feature at only one end thereof, the second alignment feature cooperating with the first alignment feature to facilitate insertion of the pin into the openings.

The method may further include providing the electrical connection by sequentially executing the following operations: inserting an end of the pin not having the second alignment into the opening associated with the first alignment feature; moving the pin through the opening associated with the first alignment feature until the second alignment feature prevents further motion; rotating the pin to align the first alignment feature with the second alignment feature; and moving the pin through the opening associated with the first alignment feature until the press-fit features at both ends of the pin secure the pin within the openings.

The above features and advantages, along with other features and advantages of the present invention, are readily apparent from the following detailed description of the invention when taken in connection with the accompanying drawings.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
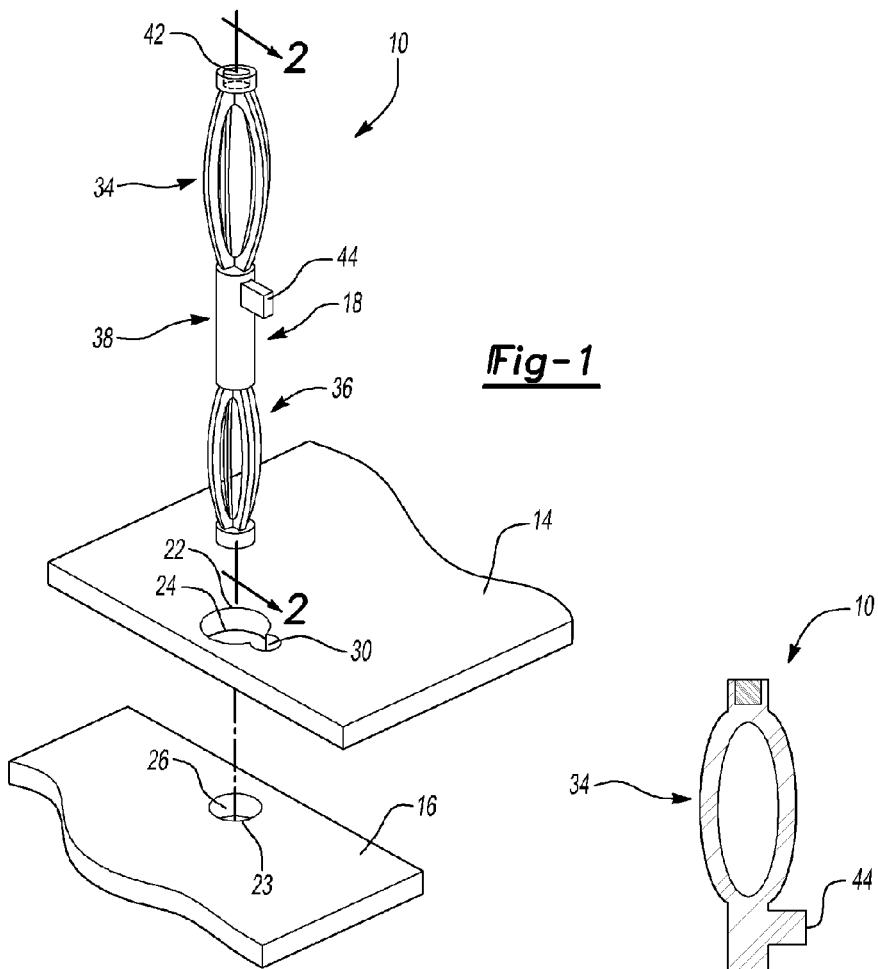
FIG. 1 illustrates a system for electrically connecting a first printed circuit board (PCB) to a second PCB with an electrically conducting pin in accordance with one non-limiting aspect of the present invention.

FIG. 1 illustrates a system 10 for electrically connecting a first printed circuit board (PCB) 14 to a second PCB 16 with an electrically conducting pin 18 in accordance with one non-limiting aspect of the present invention. The PCBs 14–16 may be associated with junction boxes or any other electrical environment where it is desirable to electrically connect multiple PCBs 14–16.

For exemplary purposes, FIG. 1 shows a single electrical connection between the PCBs 14–16, however, the present invention is not so limit. The present invention fully contemplates a blade or other arrangement having a number of pins extending between the two PCBs 14–16. The present invention fully contemplates any number of electrical connections between any number of PCBs 14–16. For example, the pin 18 may used to electrically connect more than two PCBs 14–16 without deviating from the scope and contemplation of the present invention.

The PCBs 14–16 may comprises any suitable material and feature(s) for establishing electrical connections with the pin 18. An edge trace 22–23 may be included with each PCB 14–16 to line a portion around corresponding openings 24–26 with an electrical conducting material to facilitate establishing a suitable current path between the PCBs 14–16 and the pin 18. Of course, the present invention fully contemplates any number of other features and is not intended to be limited to the foregoing.

The openings 24–26 on the PCBs for receiving the pin 18 may include any number of geographical arrangements and are shown as being generally circular as it is typically easier from a manufacturing perspective to drill circular openings within the PCBs 14–16. Any number of suitable configurations, however, may be used without deviating from the scope and contemplation of the present invention. As shown, a first one of the openings 24 is larger in diameter than a diameter of a second one of the openings 26.

The first one of the openings 24 may be associated with an auxiliary opening 30. The auxiliary opening 30 may be of a generally circular nature to correspond with the first opening 24. As described below in more detail, a portion of a circumference of the first opening 24 may intersect with a portion of the circumference of the auxiliary opening 30 to provide an alignment feature, as shown in FIG. 1. In this manner, a portion of the PCB material around a perimeter of the first opening 24 may be removed to create a gateway to the auxiliary opening 30.

The pin 28 may comprise any electrically conducting rigid or semi-rigid material having properties sufficiently suitable for providing a current path between the PCBs 14–16. The material may be selected according to any number of parameters and expected operating conditions. For example, certain types of material may be desired for high current application and certain types of material may be desired for low current applications. Other parameters of the pin 18, such as dimensioning and use of coatings and other materials, may similarly be dependent on certain operating conditions The pin 18 may include securing features 34–36 at opposite ends thereof. The securing features 34–36 may be generally characterized as expanses or other types of bulging. Optionally, the expansive portions 34–36 may include diameters larger than a diameter of a middle section 38 of the pin 18. The diameters may be selected as a function of the diameters of the openings 24–26 of the PCBs 14–16 such that, when inserted therein, the securing features 34–36 press against the openings 24–26. Optionally, the diameters may be selected such that the generated forces are sufficient for providing a press-fit therebetween. This forceful exertion is preferably sufficient to secure the electrical connection between the PCBs 14–16.

A diameter of a first one of the securing features 34 may be larger than a diameter of a second one of the securing features 36. The difference in diameter may be selected to prevent inserting the end of the pin 18 associated with the larger diameter into the smaller opening 26 of the second PCB 14. This may be helpful in limiting which end of the pin 18 is inserted into the second PCB.

For example, the pin 18 may include a connection feature 42 for electrically connecting to another device (not shown). The connection feature 42 may include a cavity or other connecting element for receiving a tab or other mating feature of the additional device. The differing dimensions of the securing features 34–36 assures that an assembler cannot insert the larger connection feature end of the pin 18 into the smaller second PCB opening 26, thereby assuring that the connection feature end is accessible from a top-side of the first PCB 14 when properly assembled, as may be desired to insure connection to the mating feature.

As shown, the securing portions 34–36 include bowed ribs around a hollowed cavity. This illustration is shown for exemplary purposes and the present invention fully contemplates and number of features and configuration for the securing portions 34–36, which may include other configurations suitable for generating forces against the openings when inserted. Optionally, one or of the ribs may be wider than the others to facilitate alignment with the auxiliary opening 30. This type of alignment feature may be advantageous in some applications, as described below in more detail.

Figure 2:
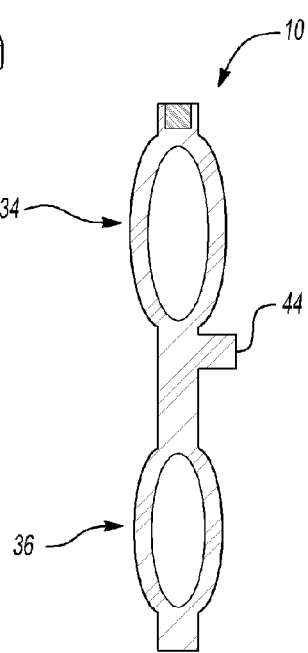
FIG. 2 illustrates a cross-sectional view of the pin shown in FIG. 1 in accordance with one non-limiting aspect of the present invention.

The pin 18 may also include a tab 44 positioned relative to the securing feature associated with the connection end of the pin 18, as shown in the cross-sectional view of FIG. 2. The tab 44 may be suitable sized and configured to correspond with the auxiliary opening 30 so as to provide an alignment feature. The tab 44 may include an axial length sufficiently selected to correspond with a thickness of the first PCB 14 to limit angling or other misalignment of the pin 18 relative to the PCBs 14–16. For example, the tab 14 may include a length equal to or greater than the thickness of the PCB 14. This can be helpful in assuring the proper alignment of the pin with the corresponding second opening 26.

As one skilled in the art will appreciate, the proper alignment of the pin 18 with the corresponding second opening 26 is critical, at least in some applications, to assure an appropriate current path between the first and second PCBs 14–16. In some application, such as in ones having blades or multiple PCB openings and pins, an assembler can rather easily insert one of the pins through non-corresponding openings on the first and second PCBs. This can be problematic to circuits and other features associated with the PCBs.

Figure 3:
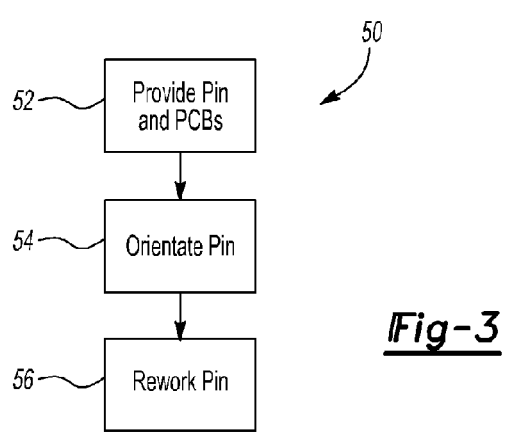
FIG. 3 illustrates a flowchart of a method of solderlessly providing an electrical connection between at least two PCBs in accordance with one non-limiting aspect of the present invention.

FIG. 3 illustrates a flowchart 50 of a method of solderlessly providing an electrical connection between at least two PCBs in accordance with one non-limiting aspect of the present invention. The method may be embodied in a computer-readable medium or other logically executing entity, such as for use in controlling an automation machine or directing a human assembler to assemble the pin 18 within the first and second PCBs 14–16 shown in FIG. 1.

Block 52 relates to providing at least two PCBs 14–16 and drilling or otherwise providing the openings 24–26 therein for receiving the electrically conducting pin 18. Optionally, electrically conducting materials 22 may be provide around the openings to provide a current path thereto. Circuits and other electronics may be included on the PCBs 14–16 for interfacing current provided through the pin 18. Optionally, more than one opening may be provided through the PCBs 14–16 to accommodate multiple pin connections.

Block 54 relates to orientating the pin 18 to establish a solderless connection between the PCBs 14–16. This may include inserting and re-inserting the pin 18 if the larger diameter securing feature 34 is inserted through the first PCB opening 24 prior to the smaller diameter securing feature 36, which may occur if the differing diameters are used to insure proper orientation of the connection feature relative to the top-side of the PCB 14. This may also include rotating the pin 18 so as to align one of the above-described alignment features on the pin 18 with the auxiliary opening 30, which may be desirable to insure the pin 18 connects corresponding openings on the first and second PCBs 14–16.

Block 56 relates to reworking the assembled pin 18 and PCB 14–16. The reworking may comprise replacing the inserted pin 18 with another pin having a different connection feature 42 or other item. This may be done to facilitate modification of the PCBs 16–18, device-troubleshooting, and/or component addition, amongst other applications.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

What is claimed is:

1. A system for solderlessly providing an electrical connection between at least two printed circuit boards (PCBs), the system comprising:
    at least one PCB operatively configured with a complimentary alignment feature,
    an electrically conducting pin having multiple securing features, wherein the pin includes at least one securing feature for each PCB, and the pin further includes a first alignment feature to facilitate orientating insertion of the pin through the complimentary alignment feature of the one PCB; and
    a second alignment feature orienting the pin relative to each PCB wherein,
    the first, second and complimentary alignment features in concert, define a singular orientation of the pin to the PCBs.

2. The system of claim 1 wherein at least one of the securing features is a press-fit feature configured to secure the pin through forceful exertion against at least one of the PCBs.

3. The system of claim 2 wherein the press-fit feature and the first alignment feature are located proximate a common end of the pin.

4. The system of claim 1 wherein each PCB includes an opening for receiving the pin and providing an electrical connection thereto.

5. The system of claim 4 wherein the first alignment feature cooperating with the complimentary alignment feature in concert with the securing features facilitates the single orientation wherein the pin inserts into and through the PCB opening.

6. The system of claim 4 wherein the openings are circular openings.

7. The system of claim 6 wherein the second alignment feature is a circular opening configured to cooperate with an adjacent circular opening.

8. The system of claim 7 wherein at least a portion of a circumference of the opening of the second alignment feature intersects with at least a portion of a circumference of the adjacent circular opening.

9. The system of claim 1 wherein each of the securing features are press-fit features configured to secure the pin through forceful exertion against at least one of the PCBs.

10. The system of claim 1 wherein each end of the pin includes securing features and the securing feature at one end of the pin is larger than the securing feature at the other end of the pin.

11. The system of claim 1 wherein the first alignment feature is separate from the securing features.

12. The system of claim 1 wherein the pin includes a connection feature at one end for receiving a mating feature, wherein the alignment features are configured to require the connection feature end of the pin to extend from a top-side of the one PCB when properly assembled.

13. A system for solderlessly providing an electrical connection between at least two printed circuit boards (PCBs), the system comprising:
    at least one PCB operatively configured with a complimentary alignment feature,
    a electrically conducting pin having multiple securing features, wherein the pin includes at least one securing feature for each PCB, and the pin further includes a first alignment feature to facilitate orienting insertion of the pin through the complimentary alignment feature of the one PCB;
    a second alignment feature to facilitate orienting the pin relative to each PCB;
    wherein each PCB includes a circular opening for receiving the pin and providing an electrical connection thereto;
    wherein the complimentary alignment feature is a circular opening configured to cooperate with one of the other circular openings; and
    wherein at least a portion of a circumference of the opening of the complimentary alignment feature intersects with at least a portion of a circumference of an adjacent circular opening.

14. The system of claim 13 wherein at least one of the securing features is press-fit feature configured to secure the pin through forceful exertion within an opening of at least one of the PCBs.

15. The system of claim 13 wherein the first alignment feature cooperating with the complimentary alignment feature in concert with the securing features facilitates the single orientation wherein the pin inserts into and through the PCB opening.

16. The system of claim 13 wherein each of the securing features are press-fit features configured to secure the pin through forceful exertion within an opening of at least one of the PCBs.

17. The system of claim 13 wherein each end of the pin includes securing features and the securing feature at one end of the pin is larger than the securing feature at the other end of the pin.

18. The system of claim 13 wherein the first alignment feature is separate from the securing features.

19. A method of solderlessly providing an electrical connection between at least two printed circuit boards (PCBs), the method comprising:
    configuring each PCB to include openings for receiving an electrically conducting pin having properties sufficient for providing the electrical connection between the PCBs;
    configuring one of the PCBs to include a complimentary alignment feature, the complimentary alignment feature cooperating with at least one of the openings;
    configuring press-fit securing features for securing the pin through forceful exertion within the openings; and
    configuring cooperation between the first alignment feature and the complimentary alignment feature in concert with the securing features to facilitate one-way insertion of the pin into the PCB openings.

20. The method of claim 19 further comprising providing the electrical connection by sequentially executing the following operations: inserting an end of the pin furthest from the first alignment feature into the opening associated with the complimentary alignment feature; moving the pin through the opening associated with the complimentary alignment feature until the first alignment feature prevents further insertion; rotating the pin to align the first alignment feature with the complimentary alignment feature; and further inserting the pin through the opening associated with the complimentary alignment feature until the press-fit features of the pin secure the pin within the PCB openings.

* * * * *